United States Patent
Brondum et al.

(10) Patent No.: US 7,866,342 B2
(45) Date of Patent: Jan. 11, 2011

(54) VALVE COMPONENT FOR FAUCET

(75) Inventors: Klaus Brondum, Longmont, CO (US); Richard P. Welty, Boulder, CO (US); Douglas S. Richmond, Zionsville, IN (US); Patrick B. Jonte, Zionsville, IN (US); Kurt Thomas, Indianapolis, IN (US)

(73) Assignee: Vapor Technologies, Inc., Longmont, CO (US)

( * ) Notice: Subject to any disclaimer, the term of this patent is extended or adjusted under 35 U.S.C. 154(b) by 824 days.

(21) Appl. No.: 11/784,765

(22) Filed: Apr. 9, 2007

(65) Prior Publication Data

US 2007/0278444 A1 Dec. 6, 2007

Related U.S. Application Data

(63) Continuation-in-part of application No. 11/201,395, filed on Aug. 10, 2005, now Pat. No. 7,216,661, which is a continuation of application No. 10/741,848, filed on Dec. 18, 2003, now Pat. No. 6,935,618, which is a continuation of application No. 10/322,871, filed on Dec. 18, 2002, now Pat. No. 6,904,935.

(51) Int. Cl.
*F16K 25/00* (2006.01)

(52) U.S. Cl. .............................. 137/625.17; 137/625.41; 251/368

(58) Field of Classification Search .................. 251/368; 137/625.17, 625.41
See application file for complete search history.

(56) References Cited

U.S. PATENT DOCUMENTS

| 2,020,286 | A | 11/1935 | Bittle |
|---|---|---|---|
| 2,411,867 | A | 12/1946 | Brenner |
| 2,639,116 | A | 5/1953 | Green |
| 2,793,282 | A | 5/1957 | Steigerwald |
| 2,861,166 | A | 11/1958 | Cargill, Jr. |
| 2,947,610 | A | 8/1960 | Hall et al. |
| 2,968,723 | A | 1/1961 | Steigerwald |
| 3,141,746 | A | 7/1964 | De Lai |
| 3,173,175 | A | 3/1965 | Lemelson |

(Continued)

FOREIGN PATENT DOCUMENTS

CH 683844 A5 5/1994

(Continued)

OTHER PUBLICATIONS

Aksenov et al., High-efficiency Source of pure carbon plasma, Sov. Phys. Tech. Phys., Sep. 1980, pp. 1164-1166, vol. 25(9).

(Continued)

*Primary Examiner*—John Bastianelli
(74) *Attorney, Agent, or Firm*—Foley & Lardner LLP

(57) ABSTRACT

A wear resistant component for a faucet valve includes a substrate comprising a base material and a strengthening layer provided above the substrate in an amount sufficient to improve abrasion resistance of the substrate. The strengthening layer includes at least one material selected from the group consisting of tantalum, chromium, zirconium, and tungsten. The wear resistant component also includes a layer that includes amorphous diamond provided above the strengthening layer, the amorphous diamond having $sp^3$ bonding of at least about 40%, a hardness of at least about 45 GPa, and an elastic modulus of at least about 400 GPa.

32 Claims, 2 Drawing Sheets

U.S. PATENT DOCUMENTS

| | | |
|---|---|---|
| 3,207,582 A | 9/1965 | Inoue |
| 3,346,458 A | 10/1967 | Schmidt |
| 3,371,404 A | 3/1968 | Lemelson |
| 3,384,119 A | 5/1968 | Manoogian |
| 3,504,063 A | 3/1970 | Lemelson |
| 3,607,061 A | 9/1971 | Angus |
| 3,615,208 A | 10/1971 | Byron |
| 3,630,677 A | 12/1971 | Angus |
| 3,630,678 A | 12/1971 | Gardner |
| 3,630,679 A | 12/1971 | Angus |
| 3,635,811 A | 1/1972 | Lane |
| 3,667,503 A | 6/1972 | Farrell et al. |
| 3,702,573 A | 11/1972 | Nemeth |
| 3,714,332 A | 1/1973 | Rasquin et al. |
| 3,747,638 A | 7/1973 | Manoogian et al. |
| 3,766,914 A | 10/1973 | Jacobs |
| 3,794,026 A | 2/1974 | Jacobs |
| 3,813,296 A | 5/1974 | McStrack et al. |
| 3,829,969 A | 8/1974 | Fischbein et al. |
| 3,840,451 A | 10/1974 | Golyanov et al. |
| 3,854,493 A | 12/1974 | Farrell |
| 3,879,175 A | 4/1975 | Levitt |
| 3,912,500 A | 10/1975 | Vereschagin et al. |
| 3,913,280 A | 10/1975 | Hall |
| 3,916,506 A | 11/1975 | Wolf |
| 3,929,432 A | 12/1975 | Caveney |
| 3,934,612 A | 1/1976 | Kast |
| 3,941,903 A | 3/1976 | Tucker, Jr. |
| 3,953,178 A | 4/1976 | Engel |
| 3,959,557 A | 5/1976 | Berry |
| 3,965,935 A | 6/1976 | Morisseau |
| 4,006,540 A | 2/1977 | Lemelson |
| 4,018,241 A | 4/1977 | Sodal et al. |
| 4,029,368 A | 6/1977 | Tschirky et al. |
| 4,054,426 A | 10/1977 | White |
| 4,084,942 A | 4/1978 | Villalobos |
| 4,104,441 A | 8/1978 | Fedoseev et al. |
| 4,115,156 A | 9/1978 | Straumann |
| 4,162,954 A | 7/1979 | Morrison, Jr. |
| 4,173,522 A | 11/1979 | Pulker et al. |
| 4,183,377 A | 1/1980 | Bernat |
| 4,190,301 A | 2/1980 | Lachonius et al. |
| 4,228,142 A | 10/1980 | Holcombe, Jr. et al. |
| 4,241,135 A | 12/1980 | Lee et al. |
| 4,260,203 A | 4/1981 | Garner |
| 4,325,403 A | 4/1982 | Uhlmann |
| 4,327,758 A | 5/1982 | Uhlmann |
| 4,345,798 A | 8/1982 | Cortes |
| 4,367,130 A | 1/1983 | Lemelson |
| 4,378,029 A | 3/1983 | Parkison |
| 4,385,880 A | 5/1983 | Lemelson |
| 4,387,287 A | 6/1983 | Marazzi |
| 4,394,400 A | 7/1983 | Green et al. |
| 4,410,054 A | 10/1983 | Nagel et al. |
| 4,434,188 A | 2/1984 | Kamo et al. |
| 4,457,491 A | 7/1984 | Dudman |
| 4,468,138 A | 8/1984 | Nagel |
| 4,490,229 A | 12/1984 | Mirtich et al. |
| 4,492,845 A | 1/1985 | Kljuchko et al. |
| 4,504,519 A | 3/1985 | Zelez |
| 4,509,519 A | 4/1985 | Detsch |
| 4,524,106 A | 6/1985 | Flasck |
| 4,531,273 A | 7/1985 | Smith et al. |
| 4,532,149 A | 7/1985 | McHargue |
| 4,540,636 A | 9/1985 | MacIver et al. |
| 4,554,208 A | 11/1985 | MacIver et al. |
| RE32,106 E | 4/1986 | Lemelson |
| 4,591,418 A | 5/1986 | Snyder |
| 4,594,294 A | 6/1986 | Eichen et al. |
| 4,597,844 A | 7/1986 | Hiracki et al. |
| 4,610,577 A | 9/1986 | Spensberger |
| 4,618,505 A | 10/1986 | MacIver et al. |
| 4,620,601 A | 11/1986 | Nagel |
| 4,621,031 A | 11/1986 | Scruggs |
| 4,661,213 A | 4/1987 | Dorsett et al. |
| 4,663,183 A | 5/1987 | Ovshinsky et al. |
| 4,666,318 A | 5/1987 | Harrison |
| 4,696,829 A | 9/1987 | Legg |
| 4,698,256 A | 10/1987 | Giglia et al. |
| 4,702,808 A | 10/1987 | Lemelson |
| 4,707,384 A | 11/1987 | Schachner et al. |
| 4,708,496 A | 11/1987 | McPherson |
| 4,708,888 A | 11/1987 | Mitchell et al. |
| 4,714,660 A | 12/1987 | Gates, Jr. |
| 4,720,199 A | 1/1988 | Geczy et al. |
| 4,720,349 A | 1/1988 | Kobayashi et al. |
| 4,720,918 A | 1/1988 | Curry et al. |
| 4,724,058 A | 2/1988 | Morrison, Jr. |
| 4,725,345 A | 2/1988 | Sakamoto et al. |
| 4,729,440 A | 3/1988 | Hall |
| 4,732,364 A | 3/1988 | Seger et al. |
| 4,732,491 A | 3/1988 | Geczy |
| 4,734,339 A | 3/1988 | Schachner et al. |
| 4,755,237 A | 7/1988 | Lemelson |
| 4,756,631 A | 7/1988 | Jones |
| 4,761,217 A | 8/1988 | Dorsett et al. |
| 4,764,036 A | 8/1988 | McPherson |
| 4,764,434 A | 8/1988 | Aronsson et al. |
| 4,767,608 A | 8/1988 | Matsumoto et al. |
| 4,776,862 A | 10/1988 | Wiand |
| 4,778,730 A | 10/1988 | Zucker |
| 4,783,368 A | 11/1988 | Yamamoto et al. |
| 4,797,009 A | 1/1989 | Yamazaki |
| 4,810,584 A | 3/1989 | Yu-Zhong |
| 4,816,286 A | 3/1989 | Hirose |
| 4,816,291 A | 3/1989 | Desphandey et al. |
| 4,816,682 A | 3/1989 | Levitt et al. |
| 4,822,355 A | 4/1989 | Bhuvaneshwar |
| 4,822,466 A | 4/1989 | Rabalais et al. |
| 4,824,262 A | 4/1989 | Kamigaito et al. |
| 4,832,075 A | 5/1989 | Dubach |
| 4,832,993 A | 5/1989 | Coulon |
| 4,837,089 A | 6/1989 | Araki et al. |
| 4,842,937 A | 6/1989 | Meyer et al. |
| 4,842,945 A | 6/1989 | Ito et al. |
| 4,848,199 A | 7/1989 | Kelm |
| 4,849,199 A | 7/1989 | Pinneo |
| 4,849,290 A | 7/1989 | Fujimori et al. |
| 4,858,556 A | 8/1989 | Siebert |
| 4,859,493 A | 8/1989 | Lemelson |
| 4,871,581 A | 10/1989 | Yamazaki |
| 4,874,596 A | 10/1989 | Lemelson |
| 4,882,138 A | 11/1989 | Pinneo |
| 4,889,195 A | 12/1989 | Kruger et al. |
| 4,892,420 A | 1/1990 | Kruger |
| 4,900,628 A | 2/1990 | Ikegaya et al. |
| 4,902,535 A | 2/1990 | Garg et al. |
| 4,904,542 A | 2/1990 | Mroczkowski |
| 4,919,974 A | 4/1990 | McCune et al. |
| 4,933,058 A | 6/1990 | Bache et al. |
| 4,935,303 A | 6/1990 | Ikoma et al. |
| 4,935,313 A | 6/1990 | Knapp et al. |
| 4,938,940 A | 7/1990 | Hirose et al. |
| 4,940,015 A | 7/1990 | Kobashi et al. |
| 4,948,629 A | 8/1990 | Hacker et al. |
| 4,950,543 A | 8/1990 | Winter et al. |
| 4,960,643 A | 10/1990 | Lemelson |
| 4,961,958 A | 10/1990 | Desphandey et al. |
| 4,966,789 A | 10/1990 | Knapp et al. |
| 4,968,326 A | 11/1990 | Wiand |
| 4,973,494 A | 11/1990 | Yamazaki |
| 4,974,498 A | 12/1990 | Lemelson |
| 4,985,229 A | 1/1991 | Obitsu et al. |
| 4,987,007 A | 1/1991 | Wagal et al. |

| Patent No. | Date | Inventor |
|---|---|---|
| 4,991,822 A | 2/1991 | Enke |
| 4,992,298 A | 2/1991 | Deutchman et al. |
| 4,997,636 A | 3/1991 | Prins |
| 5,006,203 A | 4/1991 | Purdes |
| 5,009,923 A | 4/1991 | Ogata et al. |
| 5,021,628 A | 6/1991 | Lemelson |
| 5,024,977 A | 6/1991 | Friederich et al. |
| 5,032,243 A | 7/1991 | Bache et al. |
| 5,036,733 A | 8/1991 | Tiholiz et al. |
| 5,037,212 A | 8/1991 | Justman et al. |
| 5,037,522 A | 8/1991 | Vergason |
| 5,040,501 A | 8/1991 | Lemelson |
| 5,046,703 A | 9/1991 | Kamiyama et al. |
| 5,055,318 A | 10/1991 | Deutchman et al. |
| 5,064,682 A | 11/1991 | Kiyama et al. |
| 5,067,826 A | 11/1991 | Lemelson |
| 5,068,148 A | 11/1991 | Nakahara et al. |
| 5,070,274 A | 12/1991 | Yoshikawa et al. |
| 5,075,094 A | 12/1991 | Morrish et al. |
| 5,082,359 A | 1/1992 | Kirkpatrick |
| 5,088,202 A | 2/1992 | Boland et al. |
| 5,094,915 A | 3/1992 | Subramaniam |
| 5,096,352 A | 3/1992 | Lemelson |
| 5,098,737 A | 3/1992 | Collins et al. |
| 5,100,565 A | 3/1992 | Fujiwara et al. |
| 5,104,634 A | 4/1992 | Calcote |
| 5,114,696 A | 5/1992 | Purdes |
| 5,114,745 A | 5/1992 | Jones |
| 5,124,179 A | 6/1992 | Garg et al. |
| 5,126,274 A | 6/1992 | McIver et al. |
| 5,127,983 A | 7/1992 | Imai et al. |
| 5,129,289 A | 7/1992 | Boland et al. |
| 5,131,941 A | 7/1992 | Lemelson |
| 5,132,105 A | 7/1992 | Remo |
| 5,132,587 A | 7/1992 | Lemelson |
| 5,135,808 A | 8/1992 | Kimock et al. |
| 5,135,941 A | 8/1992 | Djuric et al. |
| 5,137,398 A | 8/1992 | Omori et al. |
| 5,139,621 A | 8/1992 | Alexander et al. |
| 5,142,785 A | 9/1992 | Grewal et al. |
| 5,158,695 A | 10/1992 | Yashchenko et al. |
| 5,161,728 A | 11/1992 | Li |
| 5,164,051 A | 11/1992 | Komaki et al. |
| 5,165,955 A | 11/1992 | Gentle |
| 5,170,993 A | 12/1992 | Bonetti |
| 5,171,607 A | 12/1992 | Cumbo |
| 5,185,179 A | 2/1993 | Yamazaki et al. |
| 5,190,823 A | 3/1993 | Anthony et al. |
| 5,205,188 A | 4/1993 | Repenning et al. |
| 5,224,969 A | 7/1993 | Chen et al. |
| 5,225,366 A | 7/1993 | Yoder |
| 5,227,196 A | 7/1993 | Itoh |
| 5,232,568 A | 8/1993 | Parent et al. |
| 5,237,967 A | 8/1993 | Willermet et al. |
| 5,239,746 A | 8/1993 | Goldman |
| 5,242,741 A | 9/1993 | Sugiyama et al. |
| 5,245,104 A | 9/1993 | Cullick |
| 5,246,035 A | 9/1993 | Skyllingstad et al. |
| 5,249,554 A | 10/1993 | Tamor et al. |
| 5,255,929 A | 10/1993 | Lemelson |
| 5,257,558 A | 11/1993 | Farzin-Nia et al. |
| 5,260,141 A | 11/1993 | Tsai et al. |
| 5,279,723 A | 1/1994 | Falabella et al. |
| 5,281,274 A | 1/1994 | Yoder |
| 5,284,394 A | 2/1994 | Lemelson |
| 5,288,556 A | 2/1994 | Lemelson |
| 5,295,305 A | 3/1994 | Hahn et al. |
| 5,296,274 A | 3/1994 | Movchan et al. |
| 5,300,942 A | 4/1994 | Dolgoff |
| 5,314,652 A | 5/1994 | Simpson et al. |
| 5,322,735 A | 6/1994 | Fridez et al. |
| 5,332,348 A | 7/1994 | Lemelson |
| 5,338,027 A | 8/1994 | Rehkemper et al. |
| 5,349,265 A | 9/1994 | Lemelson |
| 5,352,493 A | 10/1994 | Dorfman et al. |
| 5,360,227 A | 11/1994 | Lemelson |
| 5,364,192 A | 11/1994 | Damm et al. |
| 5,366,556 A | 11/1994 | Prince et al. |
| 5,370,195 A | 12/1994 | Keshavan et al. |
| 5,382,293 A | 1/1995 | Kawarada et al. |
| 5,388,027 A | 2/1995 | Pollock et al. |
| 5,391,407 A | 2/1995 | Dearnaley |
| 5,391,409 A | 2/1995 | Shibata et al. |
| 5,392,982 A | 2/1995 | Li |
| 5,393,572 A | 2/1995 | Dearnaley |
| 5,395,221 A | 3/1995 | Tucker, Jr. et al. |
| 5,397,347 A | 3/1995 | Cuilleron et al. |
| 5,401,543 A | 3/1995 | O'Neill et al. |
| 5,403,399 A | 4/1995 | Kurihara et al. |
| 5,405,645 A | 4/1995 | Sevillano et al. |
| 5,411,797 A | 5/1995 | Davanloo et al. |
| 5,415,704 A | 5/1995 | Davidson |
| 5,437,243 A | 8/1995 | Pike-Biegunski |
| 5,441,013 A | 8/1995 | Jeng et al. |
| 5,449,569 A | 9/1995 | Schumm, Jr. |
| 5,451,307 A | 9/1995 | Bennett et al. |
| 5,456,406 A | 10/1995 | Lemelson |
| 5,462,722 A | 10/1995 | Liu et al. |
| 5,462,772 A | 10/1995 | Lemelson |
| 5,462,776 A | 10/1995 | Gruen |
| 5,474,816 A | 12/1995 | Falabella |
| 5,476,693 A | 12/1995 | Lee et al. |
| 5,478,650 A | 12/1995 | Davanloo et al. |
| 5,480,527 A | 1/1996 | Welty |
| 5,529,805 A | 6/1996 | Iacovangelo et al. |
| 5,529,815 A | 6/1996 | Lemelson |
| 5,533,347 A | 7/1996 | Ott et al. |
| 5,541,003 A | 7/1996 | Nakayama et al. |
| 5,541,016 A | 7/1996 | Schumm, Jr. |
| 5,543,684 A | 8/1996 | Kumar et al. |
| 5,549,764 A | 8/1996 | Biltgen et al. |
| 5,551,903 A | 9/1996 | Kumar et al. |
| 5,552,675 A | 9/1996 | Lemelson |
| 5,554,415 A | 9/1996 | Turchan et al. |
| 5,571,616 A | 11/1996 | Phillips et al. |
| 5,589,232 A | 12/1996 | Simpson |
| 5,593,234 A | 1/1997 | Liston |
| 5,601,966 A | 2/1997 | Kumar et al. |
| 5,602,679 A | 2/1997 | Dolgoff et al. |
| 5,605,759 A | 2/1997 | Prince et al. |
| 5,609,683 A | 3/1997 | Pike-Biegunski |
| 5,616,372 A | 4/1997 | Conley et al. |
| 5,616,373 A | 4/1997 | Karner et al. |
| 5,620,745 A | 4/1997 | Simpson |
| 5,626,908 A | 5/1997 | Iio et al. |
| 5,626,963 A | 5/1997 | Hirano et al. |
| 5,628,881 A | 5/1997 | Lemelson |
| 5,629,086 A | 5/1997 | Hirano et al. |
| 5,633,087 A | 5/1997 | Simpson |
| 5,643,423 A | 7/1997 | Kimock et al. |
| 5,644,130 A | 7/1997 | Raatz |
| 5,645,601 A | 7/1997 | Pope et al. |
| 5,645,900 A | 7/1997 | Ong et al. |
| 5,648,620 A | 7/1997 | Stenzel et al. |
| 5,662,965 A | 9/1997 | Deguchi et al. |
| 5,669,144 A | 9/1997 | Hahn et al. |
| 5,677,051 A | 10/1997 | Ueda et al. |
| 5,679,404 A | 10/1997 | Patten, Jr. et al. |
| 5,688,557 A | 11/1997 | Lemelson et al. |
| 5,688,677 A | 11/1997 | Ebert et al. |
| 5,705,271 A | 1/1998 | Okamura et al. |
| 5,707,409 A | 1/1998 | Martin et al. |
| 5,713,333 A | 2/1998 | Cooper et al. |
| 5,714,202 A | 2/1998 | Lemelson et al. |
| 5,718,948 A | 2/1998 | Ederyd et al. |
| 5,718,976 A | 2/1998 | Dorfman et al. |

| Patent | Date | Inventor | Patent | Date | Inventor |
|---|---|---|---|---|---|
| 5,725,573 A | 3/1998 | Dearnaley et al. | 6,207,281 B1 | 3/2001 | Itoh |
| 5,728,465 A | 3/1998 | Dorfman et al. | 6,207,282 B1 | 3/2001 | Deguchi et al. |
| 5,731,045 A | 3/1998 | Dearnaley et al. | 6,231,956 B1 | 5/2001 | Brenner et al. |
| 5,740,941 A | 4/1998 | Lemelson | 6,248,434 B1 | 6/2001 | Rodiger et al. |
| 5,743,957 A | 4/1998 | Kobashi | 6,250,604 B1 | 6/2001 | Robert |
| 5,747,118 A | 5/1998 | Bunshah et al. | 6,261,421 B1 | 7/2001 | Meunier et al. |
| 5,747,120 A | 5/1998 | McLean, II et al. | 6,287,682 B1 | 9/2001 | Grab et al. |
| 5,750,207 A | 5/1998 | Hammond et al. | 6,299,425 B1 | 10/2001 | Hirano et al. |
| 5,755,261 A | 5/1998 | Fukazawa et al. | 6,302,768 B1 | 10/2001 | Adachi |
| 5,759,623 A | 6/1998 | De Mello Borges et al. | 6,305,416 B1 | 10/2001 | Snel et al. |
| 5,763,072 A | 6/1998 | Kato et al. | 6,314,763 B1 | 11/2001 | Sakamoto |
| 5,763,087 A | 6/1998 | Falabella | 6,314,764 B1 | 11/2001 | Sakamoto |
| 5,780,119 A | 7/1998 | Dearnaley et al. | 6,331,332 B1 | 12/2001 | Wang |
| 5,786,038 A | 7/1998 | Conley et al. | 6,342,195 B1 | 1/2002 | Roy et al. |
| 5,786,068 A | 7/1998 | Dorfman et al. | 6,342,755 B1 | 1/2002 | Russ et al. |
| 5,794,801 A | 8/1998 | Lemelson | 6,347,905 B1 | 2/2002 | Lukschandel |
| 5,799,549 A | 9/1998 | Decker et al. | 6,368,664 B1 | 4/2002 | Veerasamy et al. |
| 5,803,967 A | 9/1998 | Plano et al. | 6,368,676 B1 | 4/2002 | Gaudreau et al. |
| 5,824,367 A | 10/1998 | Park et al. | 6,387,443 B1 | 5/2002 | Shi et al. |
| 5,827,613 A | 10/1998 | Nakayama et al. | 6,387,502 B1 | 5/2002 | Okamura et al. |
| 5,829,735 A | 11/1998 | Ikeda | 6,395,333 B2 | 5/2002 | Veerasamy |
| 5,836,905 A | 11/1998 | Lemelson et al. | 6,406,760 B1 | 6/2002 | Shepard, Jr. |
| 5,837,322 A | 11/1998 | Moran et al. | 6,410,125 B1 | 6/2002 | Brenner et al. |
| 5,837,331 A | 11/1998 | Menu et al. | 6,423,193 B1 | 7/2002 | Miller et al. |
| 5,837,394 A | 11/1998 | Schumm, Jr. | 6,447,843 B1 | 9/2002 | Olson |
| 5,840,132 A | 11/1998 | Erdemir et al. | 6,453,946 B2 | 9/2002 | Nichols et al. |
| 5,840,163 A | 11/1998 | Welty | 6,462,467 B1 | 10/2002 | Russ |
| 5,849,413 A | 12/1998 | Zhu et al. | 6,471,408 B1 | 10/2002 | Ikeda et al. |
| 5,853,839 A | 12/1998 | Schmeisser | 6,478,887 B1 | 11/2002 | Sue et al. |
| 5,858,471 A | 1/1999 | Ray et al. | 6,503,380 B1 | 1/2003 | Buehler |
| 5,863,606 A | 1/1999 | Okamura et al. | 6,508,416 B1 | 1/2003 | Mastro et al. |
| 5,866,195 A | 2/1999 | Lemelson | 6,508,453 B2 | 1/2003 | Mamyo |
| 5,871,805 A | 2/1999 | Lemelson | 6,514,565 B2 | 2/2003 | Dearnaley et al. |
| 5,874,175 A | 2/1999 | Li | 6,517,902 B2 | 2/2003 | Drake et al. |
| 5,888,638 A | 3/1999 | Kleinhans et al. | 6,537,429 B2 | 3/2003 | O'Donnell et al. |
| 5,897,942 A | 4/1999 | Karner et al. | 6,537,688 B2 | 3/2003 | Silvernail et al. |
| 5,900,982 A | 5/1999 | Dolgoff et al. | 6,544,627 B1 | 4/2003 | Vijayen et al. |
| 5,902,563 A | 5/1999 | Pinneo | 6,548,173 B2 | 4/2003 | Erdemir et al. |
| 5,925,413 A | 7/1999 | Holzer et al. | 6,558,757 B1 | 5/2003 | Scheibe et al. |
| 5,925,422 A | 7/1999 | Vandenbulcke et al. | 6,572,936 B1 | 6/2003 | Domoto et al. |
| 5,927,325 A | 7/1999 | Bensaoula et al. | 6,609,367 B2 | 8/2003 | Nakayasu et al. |
| 5,927,727 A | 7/1999 | Wagner et al. | 6,610,360 B2 | 8/2003 | Petrmichl et al. |
| 5,932,302 A | 8/1999 | Yamazaki et al. | 6,634,619 B2 | 10/2003 | Cusac et al. |
| 5,934,321 A | 8/1999 | Miya et al. | 6,638,570 B2 | 10/2003 | Veerasamy |
| 5,935,323 A | 8/1999 | Tanga et al. | 6,641,861 B2 | 11/2003 | Saito et al. |
| 5,940,975 A | 8/1999 | Decker et al. | 6,656,444 B1 | 12/2003 | Pinneo |
| 5,945,656 A | 8/1999 | Lemelson et al. | 6,663,753 B2 | 12/2003 | Veerasamy et al. |
| 5,952,102 A | 9/1999 | Cutler | 6,696,157 B1 | 2/2004 | David et al. |
| 5,955,212 A | 9/1999 | Matsumoto et al. | 6,720,035 B2 | 4/2004 | Andujar et al. |
| 5,961,719 A | 10/1999 | Buhaenko et al. | 6,793,849 B1 | 9/2004 | Gruen et al. |
| 5,972,233 A | 10/1999 | Becker et al. | 6,802,457 B1 | 10/2004 | Campion et al. |
| 5,985,451 A | 11/1999 | Senda et al. | 6,895,991 B2 | 5/2005 | Woessner |
| 5,992,268 A | 11/1999 | Decker et al. | 6,902,809 B1 | 6/2005 | Mittendorf |
| 6,045,916 A | 4/2000 | Shimamura et al. | 6,904,935 B2 | 6/2005 | Welty et al. |
| 6,063,455 A | 5/2000 | Jeong et al. | 6,916,004 B2 | 7/2005 | Suzuki |
| 6,066,399 A | 5/2000 | Hirano et al. | 6,921,469 B2 | 7/2005 | Larsen |
| 6,080,378 A | 6/2000 | Yokota et al. | 6,935,618 B2 | 8/2005 | Welty et al. |
| 6,080,445 A | 6/2000 | Sugiyama et al. | 7,004,197 B2 | 2/2006 | Gilbert |
| 6,080,470 A | 6/2000 | Dorfman | 7,106,939 B2 | 9/2006 | LaBrake et al. |
| 6,083,570 A | 7/2000 | Lemelson et al. | 7,108,012 B2 | 9/2006 | Rosko et al. |
| 6,096,377 A | 8/2000 | Karner et al. | 7,143,782 B2 | 12/2006 | Bantleon et al. |
| 6,099,639 A | 8/2000 | Thomas | 7,144,753 B2 | 12/2006 | Swain et al. |
| 6,099,976 A | 8/2000 | Lemelson et al. | 7,172,142 B2 | 2/2007 | Taylor et al. |
| 6,103,305 A | 8/2000 | Friedmann et al. | 7,195,817 B2 | 3/2007 | Lev et al. |
| 6,110,240 A | 8/2000 | Saguchi et al. | 7,214,600 B2 | 5/2007 | Won et al. |
| 6,131,603 A | 10/2000 | Takano et al. | 7,216,661 B2 | 5/2007 | Welty et al. |
| 6,136,386 A | 10/2000 | Nakahigashi et al. | 7,246,586 B2 | 7/2007 | Hosenfeldt et al. |
| 6,139,964 A | 10/2000 | Sathrum et al. | 7,273,536 B2 | 9/2007 | Shibata et al. |
| 6,165,616 A | 12/2000 | Lemelson et al. | 7,309,446 B1 | 12/2007 | Kley |
| 6,186,768 B1 | 2/2001 | Schmitt | 7,445,026 B2 | 11/2008 | Welty et al. |
| 6,197,438 B1 | 3/2001 | Faulkner | 2001/0020693 A1 | 9/2001 | Bischofberger et al. |
| 6,203,865 B1 | 3/2001 | Badzian et al. | 2001/0035516 A1 | 11/2001 | Nichols et al. |
| 6,204,595 B1 | 3/2001 | Falabella | 2002/0028289 A1 | 3/2002 | Veerasamy |

| | | | | | | |
|---|---|---|---|---|---|---|
| 2002/0071949 | A1 | 6/2002 | Liu et al. | JP | 61-124573 | 6/1986 |
| 2002/0127404 | A1 | 9/2002 | Veerasamy | JP | 62-196371 | 8/1987 |
| 2002/0192371 | A1 | 12/2002 | Veerasamy et al. | JP | 03-223190 | 10/1991 |
| 2003/0099835 | A1 | 5/2003 | Petrmichl et al. | JP | 04-165170 | 10/1992 |
| 2004/0038033 | A1 | 2/2004 | Massler et al. | JP | 62-72921 | 9/1994 |
| 2004/0058155 | A1 | 3/2004 | Windischmann | RU | 2295084 | 3/2007 |
| 2004/0067362 | A1 | 4/2004 | Veerasamy et al. | WO | WO 86/06758 A1 | 11/1986 |
| 2004/0069358 | A1 | 4/2004 | Knapp et al. | WO | WO87/04471 | 7/1987 |
| 2004/0118455 | A1 | 6/2004 | Welty et al. | WO | WO 90/05701 A1 | 5/1990 |
| 2005/0241239 | A1 | 11/2005 | Sung | WO | WO 92/01314 A1 | 1/1992 |
| 2006/0005900 | A1 | 1/2006 | Dorfman | WO | WO 92/15082 A1 | 9/1992 |
| 2006/0038156 | A1 | 2/2006 | Welty et al. | WO | WO93/09921 | 5/1993 |
| 2006/0059688 | A1 | 3/2006 | Tseng et al. | WO | WO 9407613 A2 | 4/1994 |
| 2006/0079863 | A1 | 4/2006 | Burgmeier et al. | WO | WO 96/01913 A1 | 1/1996 |
| 2006/0105172 | A1 | 5/2006 | Yamamoto et al. | WO | WO2005/015065 | 2/2005 |
| 2006/0150862 | A1 | 7/2006 | Zhao et al. | WO | WO 2005/015065 A2 | 2/2005 |
| 2006/0236780 | A1 | 10/2006 | Hofmann | WO | WO 2005/078045 A1 | 8/2005 |
| 2007/0074664 | A1 | 4/2007 | Nishimura et al. | | | |
| 2007/0224242 | A1 | 9/2007 | Helmuth et al. | | | |
| 2007/0278444 | A1 | 12/2007 | Brondum et al. | | | |
| 2007/0284255 | A1 | 12/2007 | Gorokhovsky et al. | | | |
| 2008/0011976 | A1 | 1/2008 | Scarlin | | | |
| 2008/0044451 | A1 | 2/2008 | Steinmuller-Nethl et al. | | | |
| 2008/0070049 | A1 | 3/2008 | Guo et al. | | | |
| 2008/0073505 | A1 | 3/2008 | Niu et al. | | | |
| 2008/0315146 | A1 | 12/2008 | Brondum et al. | | | |
| 2010/0186834 | A1 | 7/2010 | Brondum et al. | | | |
| 2010/0252130 | A1 | 10/2010 | Brondum et al. | | | |

FOREIGN PATENT DOCUMENTS

| | | |
|---|---|---|
| CN | 1729368 A | 2/2006 |
| CN | 1729368 A | 2/2006 |
| CN | 1934211 A | 3/2007 |
| DE | 3728946 A1 | 3/1989 |
| EP | 0 265 533 A1 | 5/1988 |
| EP | 318 998 B1 | 6/1989 |
| EP | 0 361 206 A1 | 4/1990 |
| EP | 0 378 378 A1 | 7/1990 |
| EP | 0 388 861 A2 | 9/1990 |
| EP | 0 388 861 A3 | 9/1990 |
| EP | 0207467 B1 | 12/1990 |
| EP | 440 326 B1 | 8/1991 |
| EP | 0 462 734 A1 | 12/1991 |
| EP | 0 509 630 A2 | 10/1992 |
| EP | 0 509 630 A3 | 10/1992 |
| EP | 0509875 A1 | 10/1992 |
| EP | 0 519 472 A2 | 12/1992 |
| EP | 0 519 472 A3 | 12/1992 |
| EP | 0 519 472 B1 | 12/1992 |
| EP | 0 520 566 A1 | 12/1992 |
| EP | 0 520 566 B1 | 12/1992 |
| EP | 0 520 567 A1 | 12/1992 |
| EP | 0 520 832 B1 | 12/1992 |
| EP | 0 462 734 B1 | 9/1993 |
| EP | 0 603 422 B1 | 6/1994 |
| EP | 0 605 814 B1 | 7/1994 |
| EP | 0 611 331 B1 | 8/1994 |
| EP | 0 388 861 B1 | 9/1994 |
| EP | 0 632 344 A2 | 1/1995 |
| EP | 0 632 344 A3 | 1/1995 |
| EP | 0 632 344 B1 | 1/1995 |
| EP | 0 676 902 A2 | 10/1995 |
| EP | 0 676 902 A3 | 10/1995 |
| EP | 0 730 129 A2 | 9/1996 |
| EP | 0 730 129 A3 | 9/1996 |
| EP | 0 826 798 A2 | 3/1998 |
| EP | 0 826 798 A3 | 3/1998 |
| EP | 0 884 509 A1 | 12/1998 |
| EP | 0892092 B1 | 10/2003 |
| JP | 57-106513 | 7/1982 |
| JP | 60-195094 | 10/1985 |
| JP | 61-106494 | 5/1986 |

OTHER PUBLICATIONS

Angus et al., Low-Pressure, Metastable Growth of Diamond and "Diamondlike" Phases, Structure and Properties of Diamond, Aug. 19, 1988, pp. 913-921.

Bakai et al., Structure of carbon films formed by the deposition of fast ions, Sov. Phys. Tech. Phys, Nov. 1981, pp. 1425-1426, vol. 26(11).

Berger et al., EELS analysis of vacuum arc-deposited diamond-like films, CSIRO, Division of applied Physics, Philosophical Magazine Letters, 1988, pp. 285-290, vol. 57, No. 6, Lindfield, New South Wales, 2070 Australia.

Cheung et al., Growth of Thin Films by Laser-Induced Evaporation, 1988, pp. 63-109 plus back page (47 total pages), vol. 15, Issue 1.

Coll et al., Diamond-like carbon films synthesized by cathodic arc evaporation, Thin Solid Films, 1992, pp. 165-173, vol. 209.

Collins et al., Microstructural and Mechanical Properties of Amorphic Diamond, Diamond Files and Technology, 1992, pp. 25-50, vol. 2, No. 1, MY Tokyo.

Feldman et al., Diamond Optics II, Proceedings—SPIE- The International Society for Optical Engineering, Spie P Proceeding Series, Aug. 7-8, 1989, pp. 37-47 plus cover pages (13 total pages), vol. 1146, San Diego, California.

Hirvonen et al., Preparation and Properties of High Density, Hydrogen Free hard Carbon Films with Direct ION Bean or ARC Discharge Deposition, Materials Science Forum, 1989, pp. 197-216, vols. 52 & 53, University of Helsinki, Department of Physics, SF-00170 Helsinki, Finland.

Kitahama et al., Synthesis of diamond by laser-induced chemical vapor deposition, Appl. Phys. Lett., Sep. 15, 1986, pp. 634-635, vol. 49(11).

Kitabatake et al., Growth of diamond at room temperature by an ion-beam sputter deposition under hydrogen-ion bombardment, J. Appl. Phys.,Aug. 15, 1985, pp. 1693-1695, vol. 58(4).

Marquardt et al., Deposition of Amorphous Carbon Films from Laser-Produced Plasmas, Mat. Res. Symp. Proc., Materials Research Society, 1985, pp. 326-335 plus cover page (11 total pages), vol. 38.

Martin et al., Structure and hardness of diamond-like carbon films prepared by arc evaporation, Journal of Materials Science Letters 7,1988, pp. 410-412.

Martin et al., ION-Beam-Deposited Films Produced by Filtered ARC Evaporation, Thin Solid Films, 1990, pp. 77-83, vol. 193/194.

Maslow et al., Pulsed Carbon-Plasma Source for Production Processes, UDC 533.9.07, 1985, pp. 662-665, Plenum Publishing Corporation.

Messier et al., From Diamond-Like Carbon to Diamond Coatings, Thin Solid Films, 1987, pp. 1-9, vol. 153.

Richter et al., About the Structure and Bonding of Laser Generated Carbon Films by Raman and Electron Energy Loss Spectroscopy, Journal of Non-Crystalline Solide, 1986, pp. 131-144, vol. 88, North-Holland, Amsterdam.

Sato et al., Deposition of Diamond-Like Carbon Films by Pulsed-Laser Evaporation, Department of Electrical and Electronic Engineering, Aug. 17, 1987, pp. L1487-L1488.

Sato et al., Diamond-Like Carbon Films Prepared by Pulsed-Laser Evaporation, Applied Physics A © Springer-Verlag, 1988, pp. 355-360.

Strel'nitskii et al., Properties of diamond-like carbon coating produced by plasma condensation, Sov. Tech. Phys. Lett., Nov. 1978, pp. 546-547, vol. 4(11).

Strel'nitskii et al., Properties of the diamond-like carbon film produced by the condensation of a plasma stream with an rf potential, Sov. Phys. Tech. Phys., Feb. 1978, pp. 222-224, vol. 23(2).

Office Action of Mexican Application No. MX/a/2007/015120, mail date May 7, 2010, 2 pages.

Office Action of Mexican Application No. MX/a/2007/015121, mail date May 7, 2010, 2 pages.

Response to Office Action for Chinese Application No. 200710153719.9, mail date Jun. 4, 2010, 6 pages.

Office Action for Chinese Application No. 200810090600.6 and translation, mail date Jan. 29, 2010, 12 pages.

Office Action for Chinese Application No. 200710153719.9, mail date Apr. 6, 2010, 3 pages.

Cuomo et al., Energetic Carbon Deposition at Oblique Angles, J. Vac. Sci. Technol. A., Nov./Dec. 1992, 7 pages, vol. 10, No. 6, ISSN 0734-2101, Coden JVTAD6, Society by the American Institute of Physics.

European Search Report for European Application No. 09160427.2, mail date Aug. 24, 2009, 5 pages.

Falabella et al., Fabrication of Amorphous Diamond Films, Thin Solid Films, 1993, pp. 82-86 (5 pages), vol. 236.

International Preliminary Report on Patentability for International Application No. PCT/US03/46081, date of completion of report Aug. 6, 2006, 3 pages.

Milne, Tetrahedrally Bonded Amorphous Carbon, Journal of Non-Crystalline Solids, 1996, 8 pages.

Notice of Allowance for U.S. Appl. No. 10/741,848, mail date Apr. 26, 2005, 8 pages.

Notice of Allowance for U.S. Appl. No. 11/201,395, mail date Jan. 12, 2007, 4 pages.

Notice of Allowance for U.S. Appl. No. 11/322,871, mail date Sep. 24, 2009, 11 pages.

Notice of Allowance for U.S. Appl. No. 11/732,948, mail date Jul. 30, 2008, 7 pages.

Office Action for Canadian Application No. 2510168, mail date Jan. 2, 2007, 2 pages.

Office Action for Canadian Application No. 2510168, mail date Oct. 11, 2007, 12 pages.

Office Action for Chinese Application No. 200380106691.3 with English translation, mail date Oct. 27, 2006, 12 pages.

Office Action for Chinese Application No. 200710153717 with English translation, mail date Jul. 31, 2009, 11 pages.

Office Action for Chinese Application No. 200710153719.9 (English translation), mail date Jun. 5, 2009, 2007, 4 pages.

Office Action for European Application No. 03816756.5, mail date Nov. 12, 2007, 4 pages.

Office Action for Indian Application No. 1391/KOLNP/05, date Aug. 14, 2009, 20 pages.

Office Action for Mexican Application No. PA/a/2005/006402, mail date Aug. 14, 2007, 2 pages.

Office Action for Russian Application No. 2009122558, mail date Jun. 15, 2009, 2 pages.

Office Action for U.S. Appl. No. 10/741,848, mail date Feb. 15, 2005, 6 pages.

Office Action for U.S. Appl. No. 10/741,848, mail date May 14, 2004, 5 pages.

Office Action for U.S. Appl. No. 10/741,848, mail date Oct. 1, 2004, 5 pages.

Office Action for U.S. Appl. No. 11/201,395, mail date Jan. 26, 2006, 6 pages.

Office Action for U.S. Appl. No. 11/201,395, mail date Sep. 26, 2006, 10 pages.

Response to Office Action for Canadian Application No. 2510168, mail date Apr. 2, 2008, 6 pages.

Response to Office Action for Canadian Application No. 2510168, mail date Jul. 3, 2007, 17 pages.

Response to Office Action for Canadian Application No. 2510168, mail date Mar. 31, 2008, 10 pages.

Response to Office Action for Chinese Application No. 200710153719.9 with English translation, mail date Oct. 20, 2009, 18 pages.

Response to Office Action for European Application No. 03816756.5, mail date Mar. 19, 2008, 17 pages.

Response to Office Action for European Application No. 03816756.5, mail date Mar. 25, 2008, 16 pages.

Response to Office Action for Indian Application No. 1391/KOLNP/05, mail date Apr. 28, 2008, 29 pages.

Response to Office Action for U.S. Appl. No. 10/741,848, mail date Jan. 3, 2005, 14 pages.

Response to Office Action for U.S. Appl. No. 10/741,848, mail date Mar. 8, 2005, 8 pages.

Response to Office Action for U.S. Appl. No. 11/201,395, mail date May 23, 2006, 20 pages.

Response to Office Action for U.S. Appl. No. 11/201,395, mail date Oct. 20, 2006, 14 pages.

Robertson, Amorphous Carbon, Current Opinion in Solid State & Materials Science, 1996, 6 pages, ISSN 1359-0286.

Supplemental Notice of Allowance for U.S. Appl. No. 11/201,395, mail date Feb. 6, 2007, 3 pages.

Supplementary European Search Report for European Application No. 03816756, date of completion Aug. 2, 2007, 2 pages.

International Search Report for PCT/US03/040681, date of mailing Feb. 22, 2005, 1 page.

PCT Written Opinion for PCT/US03/040681, no date of mailing referenced, 4 pages.

European Search Report for European Application No. 08005755, date of completion Jun. 21, 2010, 6 pages.

Office Action for U.S. Appl. No. 11/322,871, mail date Mar. 12, 2004, 5 pages.

Response to Office Action for U.S. Appl. No. 11/322,871, mail date Jul. 8, 2004, 15 pages.

Collins et al., "Laser plasma source of amorphic diamond," *Applied Physics Letters*, Jan. 16, 1989, 4 pages, vol. 54, No. 3.

Mirtich et al., "Diamondlike Carbon Protective Coatings for IR Materials," 1985, 14 pages.

Notice of Allowance for U.S. Appl. No. 12/141,848, dated Sep. 28, 2010, 7 pages.

Office Action for Chinese Application No. 200810090600.6 and translation, bearing date of Aug. 4, 2010, and received via e-mail on Sep. 15, 2010, 13 pages.

VALVE COMPONENT FOR FAUCET

CROSS-REFERENCE TO RELATED APPLICATIONS

This application is a Continuation-In-Part of U.S. patent application Ser. No. 11/201,395 filed Aug. 10, 2005, which is a Continuation of U.S. patent application Ser. No. 10/741,848 filed Dec. 18, 2003 (now U.S. Pat. No. 6,935,618), which is a Continuation of U.S. patent application Ser. No. 10/322,871 (now U.S. Pat. No. 6,904,935), filed Dec. 18, 2002. The entire disclosures for each of the following applications are incorporated herein by reference in their entirety: U.S. patent application Ser. No. 11/201,395; U.S. patent application Ser. No. 10/741,848; and U.S. patent application Ser. No. 10/322,871.

BACKGROUND

This invention relates generally to multi-layer surface coatings for use with articles of manufacture and products requiring low friction, low wear, and protective exterior surfaces. More particularly, the invention is related to articles having mutually sliding components, such as valve components for water mixing valves, having surface protective layers comprising a strengthening layer and an outer amorphous diamond coating.

In certain applications, such as for example, valve plates for fluid control valves, there is a need for mutually sliding surfaces to be wear resistant, abrasion resistant, scratch resistant, and to have a low coefficient of friction. The elements of one type of control valve for mixing of hot and cold water streams typically comprise a stationary disk and a moveable sliding disk, although the plate elements may be of any shape or geometry having a sealing surface, including e.g. flat, spherical, and cylindrical surfaces. The term "disk" herein therefore refers to valve plates of any shape and geometry having mating surfaces which engage and slide against each other to form a fluid-tight seal. The stationary disk typically has a hot water inlet, a cold water inlet, and a mixed water discharge outlet, while the moveable disk contains similar features and a mixing chamber. It is to be understood that the mixing chamber need not be in the disk but could part of an adjacent structure. The moveable disk overlaps the stationary disk and may be slid and/or rotated on the stationary disk so that mixed water at a desired temperature and flowrate is obtained in the mixing chamber by regulating the flowrate and proportions of hot water and cold water admitted from the hot water inlet and the cold water inlet and discharged through the mixed water discharge outlet. The disks mating sealing surfaces should be fabricated with sufficient precision to allow the two sealing surfaces to mate together and form a fluid tight seal (i.e. they must be co-conformal and smooth enough to prevent fluid from passing between the sealing surfaces). The degree of flatness (for a flat plate shape), or co-conformity (for non-flat surfaces) and smoothness required depend somewhat on the valve construction and fluids involved, and are generally well known in the industry. Other types of disk valves, while still using mating sealing surfaces in sliding contact with each other, may control only one fluid stream or may provide mixing by means of a different structure or port configuration. The stationary disk may for example be an integral part of the valve body.

Previous experience with this type of control valve has demonstrated there is a problem of wear of the mating surfaces of the disks due to the fact that the stationary and moveable disks are in contact and slide against each other (see for example U.S. Pat. Nos. 4,935,313 and 4,966,789). In order to minimize the wear problem, these valve disks are usually made of a sintered ceramic such as alumina (aluminum oxide). While alumina disks have good wear resistance, they have undesirable frictional characteristics in that operating force increases, and they tend to become "sticky" after the lubricant grease originally applied to the disks wears and washes away. The scratch and abrasion resistance of alumina plates to large and small particles (respectively) in the water stream is good; however, they are still susceptible to damage from contaminated water streams containing abrasive particles such as sand; and improvement in this regard would be beneficial. Additionally, the porous nature of the sintered ceramic disks makes them prone to "lockup" during long periods of non-use, due to minerals dissolved in the water supply that precipitate and crystallize between coincident pores in the mating surfaces. One objective of the present invention is to provide disks having reduced wear, improved scratch and abrasion resistance and reduced frictional characteristics. Another objective is to provide non-porous or reduced-porosity valve disks to reduce the number of locations where precipitated crystals may form between the mating surfaces.

It would be advantageous to use a material for the disks, such as metal, which is less expensive, easier to grind and polish and which is not porous. However, the wear resistance and frictional behavior of bare metallic disks is generally not acceptable for sliding seal applications. A further objective of the present invention is to provide disks made of metal a base material and having improved wear, scratch, and abrasion resistance and improved frictional characteristics as compared to uncoated ceramic disks.

It is disclosed in the prior art (e.g. U.S. Pat. Nos. 4,707,384 and 4,734,339, which are incorporated herein by reference) that polycrystalline diamond coatings deposited by chemical vapor deposition (CVD) at substrate temperatures around 800-1000 C can be used in combination with adhesion layers of various materials in order to provide scratch and wear resistant components. Polycrystalline diamond films, however, are known to have rough surfaces due to the crystal facets of the individual diamond grains, as is apparent in the photographs of FIGS. 2 and 3 in the '384 patent. It is known in the art to polish such surfaces in order to minimize the coefficient of friction in sliding applications, or even to deposit the polycrystalline diamond on a smooth substrate and then remove the film from the substrate and use the smooth side of the film (which was previously against the substrate) rather than the original surface as the bearing surface. The present invention overcomes prior art problems by providing a number of advantageous features, including without limitation providing a smooth and very hard surface for sliding applications, while avoiding difficult and expensive post-processing of a polycrystalline diamond surface layer. The methodology also advantageously employs substrate materials (such as, suitable metals, glasses, and composite and organic materials) that cannot be processed at the elevated temperatures necessary for CVD deposition of polycrystalline diamond.

It is also disclosed in the prior art (e.g. U.S. Pat. No. 6,165,616, which is incorporated herein by reference) that engineered interface layers may be employed to relieve thermally-induced stress in a polycrystalline diamond layer. These thermally induced stresses arise during cooling of the substrate after coating deposition at relatively high temperatures, and are due to the difference in thermal expansion coefficient between the substrate and the diamond coating. Rather complicated engineering calculations are specified in '616 to predetermine the desired interface layer composition and thickness. The interface layer thickness' disclosed in '616 to minimize the thermally-induced stress in the diamond layer are of the order 20 to 25 microns according to FIGS. 1 through 3. Such thick interface layers are expensive to deposit, due to the time necessary to deposit them and the high cost of the equipment required. The present invention also advantageously includes, without limitation, minimizing the coating cost but still achieving desired results by employing much thinner interface layers than those taught by '616, and to avoid creating the thermally-induced stresses which necessitate such complicated engineering calculations by depositing a hard surface layer at a relatively low temperature compared to the prior art, such as the '616 patent.

It is further disclosed in the prior art (e.g. U.S. Pat. Nos. 4,935,313 and 4,966,789, which are incorporated herein by reference) that cubic crystallographic lattice carbon (polycrystalline diamond) and other hard materials may be used as surface coatings on valve disks, and that pairs of mutually sliding valves discs which differ from each other in either surface composition or surface finish are preferable to those which are the same in these characteristics, with respect to minimizing friction between the plates. The present invention provides one or more mating valve disk surfaces having a lower friction coefficient than the disclosed materials in water-lubricated or fluid wetted surface applications such as water valves, and to allow identical processing of both mating surfaces in order to avoid the need to purchase and operate different types of processing equipment. The present invention further provides, without limitation, one or more mating valve disk surfaces having a lower friction coefficient than the disclosed materials in water-lubricated or fluid wetted surface applications such as water valves. Furthermore, both mated sliding surfaces of the disks can be hard and have an abrasion resistance to contaminated water streams and to allow identical processing of both mating surfaces in order to avoid the need to purchase and operate different types of processing equipment.

SUMMARY

An exemplary embodiment relates to a wear resistant component for a faucet valve includes a substrate comprising a base material and a strengthening layer provided above the substrate in an amount sufficient to improve abrasion resistance of the substrate. The strengthening layer includes at least one material selected from the group consisting of tantalum, chromium, zirconium, and tungsten. The wear resistant component also includes a layer that includes amorphous diamond provided above the strengthening layer, the amorphous diamond having $sp^3$ bonding of at least about 40%, a hardness of at least about 45 GPa, and an elastic modulus of at least about 400 GPa.

Another exemplary embodiment relates to a faucet that includes a first valve plate comprising a base material, a strengthening layer provided above the base material, and an amorphous diamond material provided above the strengthening layer. The strengthening layer includes at least one material selected from the group consisting of chromium nitride, tantalum carbide, tantalum nitride, zirconium nitride, tungsten nitride, and tungsten carbide. The amorphous diamond material has a coefficient of friction that is lower than that of diamond-like carbon and has a hardness that is greater than that of diamond-like carbon.

Another exemplary embodiment relates to a faucet valve plate that includes a substrate and a layer of material comprising at least one material selected from the group consisting of tantalum carbide, tantalum nitride, zirconium nitride, tungsten nitride, and tungsten carbide provided above the substrate. The valve plate also includes an amorphous diamond layer provided above the layer of material, the amorphous diamond layer having a hardness that is greater than that of diamond-like carbon and has sp3 bonding of at least about 40%.

DETAILED DESCRIPTION

Figure 1:
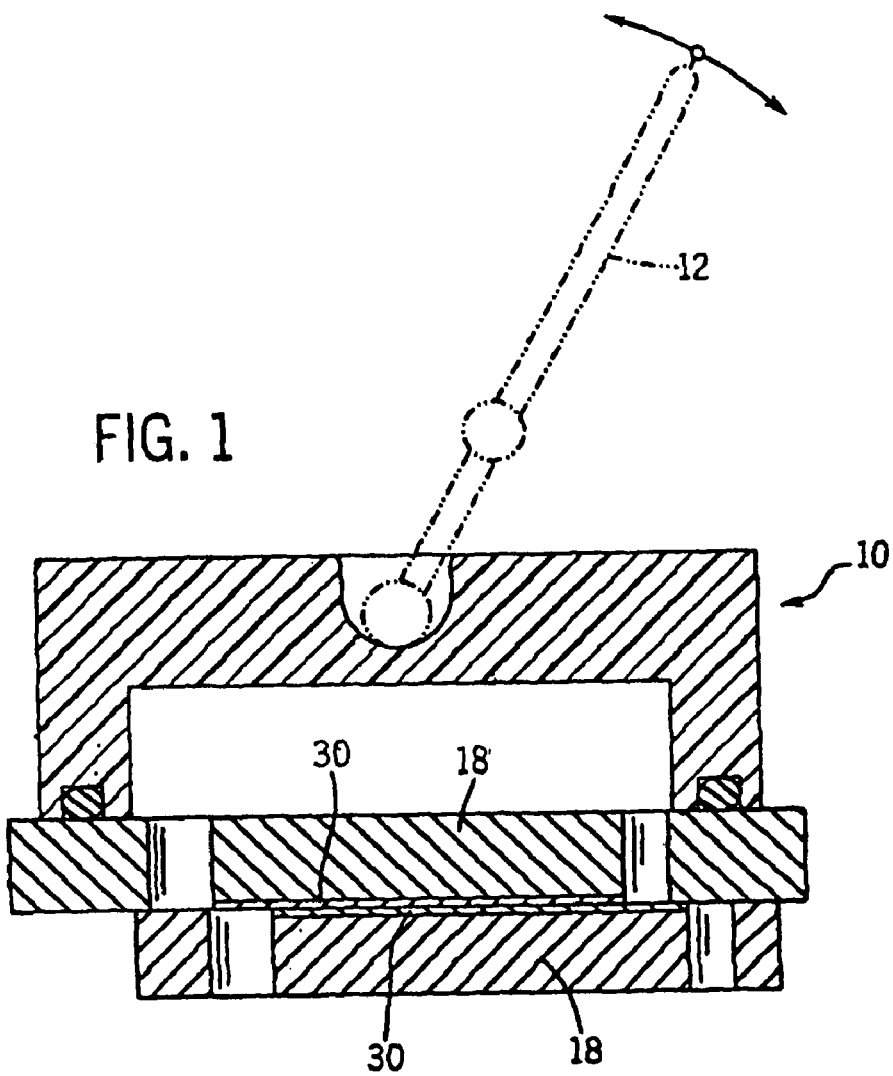
FIG. 1 is one form of valve incorporating a multi-layer structure with an amorphous diamond layer overlying a substrate.
Figure 2:
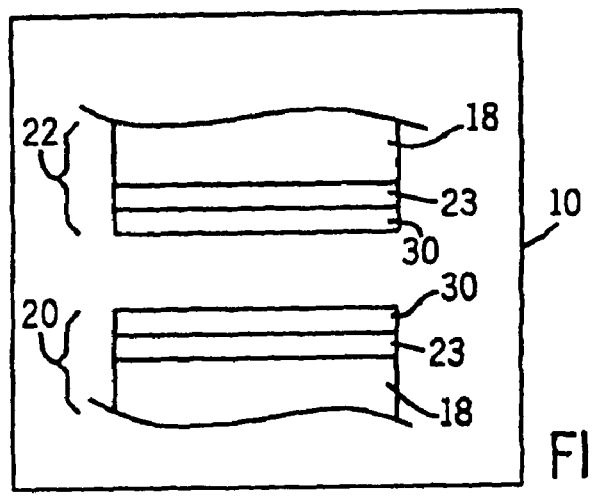
FIG. 2 is a detail of one form of multi-layer structure of the invention.
Figure 3:
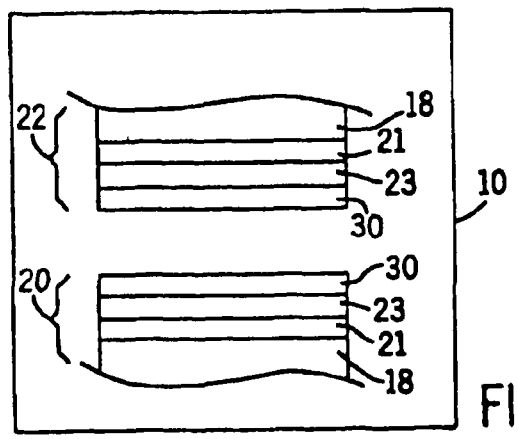
FIG. 3 illustrates yet another multi-layer structure with an added additional adhesion-promoting layer.
Figure 4:
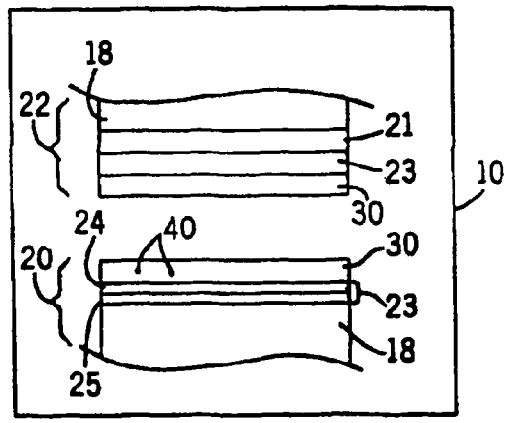
FIG. 4 is a further form of multi-layer structure of FIG. 2 wherein a strengthening layer includes two layers of different materials.

Embodiments of the invention are illustrated generally in the figures, where FIG. 1 shows one form of the valve 10 with handle 12 incorporating the invention. In particular, FIGS. 2-4 illustrate a portion of a valve 10 having a substrate 18 for a sliding component 20 and/or a fixed component 22 of the valve 10 which can comprise a base material wherein the base material can be the same or different in the sliding component 20 and the fixed component 22. In other embodiments, one of the components 20, 22 can be fixed.

Preferably the base material is a sintered ceramic or a metal. Base materials can also comprise glasses or glassy materials, cermets, polymeric materials, composite materials, intermetallic compounds such as iron aluminide, and other materials mechanically suitable for the application. The metals can include, for example, any conventional metal, including without limitation, stainless steel, brass, zirconium, titanium, aluminum, and alloys of the latter three materials. Stainless steel, titanium, and zirconium, and aluminum are the most preferred metals, with the term stainless steel referring to any type such as 304, 316, etc., and customized variations thereof and with the terms titanium, zirconium, and aluminum understood to include alloys comprised mostly of those metals. Sintered (powdered) stainless steel is a preferred substrate material because it can be economically molded into complex shapes suitable for disks and can be economically ground and polished to achieve a mating smooth sealing surface. In the case of sintered stainless steel, "fully dense" substrates and metal injection molded substrates are preferred. Titanium and zirconium are preferred base materials because they can be easily oxidized or anodized to form a hard surface layer. Ceramics can be any conventional ceramic material, including without limitation, for example, sintered alumina (aluminum oxide) and silicon carbide, with alumina being a preferred material. Composite materials can include, for example, any conventional cermets, fiber reinforced epoxies and polyamides, and carbon-carbon composites. Glass and glassy materials can include for example borosilicate glass such as Pyrex™, and materials such as toughened laminated glass and glass-ceramics. Glass, glassy materials and cermets are preferred substrates because they can be economically molded into complex shapes suitable for disks and can be economically ground and polished to a flat and smooth surface. Iron aluminide is understood to be a material consisting mainly of that iron and aluminum but may also contain small amounts of such other elements as molybdenum, zirconium, and boron.

As shown in FIG. 2, a strengthening layer 23 can also be placed directly on the substrate surface 18. This layer 23 can comprise a material having higher hardness than the substrate 18 (although it should be understood that according to other exemplary embodiments, the strengthening layer may not have a hardness that his higher than the substrate). Suitable materials for the strengthening layer 23 can include compounds of Cr, Ti, W, Zr, Ta, and any other metals conventionally known for use in hard coatings. The compounds include, without limitation, nitrides, carbides, oxides, carbo-nitrides, and other mixed-phase materials incorporating nitrogen, oxygen, and carbon.

One highly preferred material for the strengthening layer 23 is chromium nitride. Chromium nitride in the present application most preferably refers to a single or mixed phase compound of chromium and nitrogen having nitrogen content in the range of about 10 to about 50 atomic percent. The term chromium nitride also refers to a material containing such doping or alloying elements as yttrium, scandium, and lanthanum in addition to chromium and nitrogen.

Another material suitable for the strengthening layer 23 is conventional DLC (Diamond-Like Carbon), which is a form of non-crystalline carbon well known in the art and distinct from amorphous diamond. DLC coatings are described for example in U.S. Pat. No. 6,165,616 (in which they are called (a-C) coatings). DLC can be deposited by sputtering or by conventional CVD. DLC is an amorphous material with mostly sp2 carbon bonding and little of the tetrahedral sp3 bonding that characterizes amorphous diamond. The hardness of DLC is substantially lower than that of amorphous diamond and is more similar to the hardness of conventional hard coating materials such as titanium nitride and chromium nitride. The internal stresses in DLC coatings are also lower than those in amorphous diamond coatings, allowing DLC to be deposited in thicker layers than amorphous diamond without loss of adhesion. The term DLC as used herein includes hydrogenated forms of the material.

According to another exemplary embodiment, the strengthening layer comprises a tantalum-containing material such a tantalum carbide (TaC), tantalum nitride (TaN), or a tantalum carbo-nitride. One advantageous feature of using tantalum or a tantalum compound for the strengthening layer is that tantalum exhibits excellent corrosion resistance and is relatively ductile when used as a metal. Additionally, tantalum readily forms carbides having relatively high hardness values (Mohs hardness values of 9+) that are desirable for the strengthening layer to provide scratch and abrasion resistance for the substrate.

The strengthening layer 23 functions primarily to improve scratch and abrasion resistance of the multilayer coating. The hardness of the strengthening layer 23 should be at least greater than that of the substrate 18 in order to perform its intended function of improving the scratch resistance of the coated disk. The thickness of the strengthening layer 23 is at least a thickness sufficient to improve the scratch resistance of the substrate 18. For materials typically used as hard coatings, such as those disclosed above, this thickness is generally from around 500 nm to around 10 microns, and preferably from about 2000 nm to around 5000 nm. In testing of faucet water valves it has been found that a chromium nitride strengthening layer having a thickness of about 5 microns provides adequate scratch and abrasion resistance (in conjunction with a thin amorphous diamond top layer) for types and sizes of contaminants considered to be typical in municipal and well water sources.

In some embodiments of the present invention as shown in FIG. 3 and for component 22 of FIG. 4, a thin adhesion-promoting layer 21 can be deposited on the substrate 18 and then the strengthening layer 23 on the layer 21. This layer 21 functions to improve the adhesion of the overlying strengthening layer 23 to the substrate 18. Suitable materials for the adhesion-promoting layer 21 include preferably chromium and tantalum and also can include titanium, tungsten, other refractory metals, silicon, and other materials known in the art to be suitable as adhesion-promoting layers. The layer 21 can conveniently be made using the same elemental material chosen for the strengthening layer 23. The layer 21 has a thickness that is at least adequate to promote or improve the adhesion of layer 23 to the substrate 18. This thickness is generally from about 5 nm to about 200 nm, and most preferably from about 30 nm to about 60 nm. The adhesion-promoting layer 21 can be deposited by conventional vapor deposition techniques, including preferably physical vapor deposition (PVD) and also can be done by chemical vapor deposition (CVD).

PVD processes are well known and conventional and include cathodic arc evaporation (CAE), sputtering, and other conventional deposition processes. CVD processes can include low pressure chemical vapor deposition (LPCVD), plasma enhanced chemical vapor deposition (PECVD), and thermal decomposition methods. PVD and CVD techniques and equipment are disclosed, inter alia, in J. Vossen and W. Kern "Thin Film Processes II", Academic Press, 1991; R. Boxman et al, "Handbook of Vacuum Arc Science and Technology", Noyes, 1995; and U.S. Pat. Nos. 4,162,954 and 4,591,418, with the patents incorporated herein by reference.

In the case of sintered ceramic materials, although the individual granules forming the sintered material may have high hardness, the scratch resistance of the overall sintered structure as measured by scratch testing is much lower than that of the material forming the granules (e.g. alumina). This is due to the fact that the materials typically used to sinter or bond the alumina granules together, typically silicates, are not as hard as the granules themselves. The hardness of the strengthening layer 23 can be similar to or even less than the hardness of the individual granules comprising the ceramic disk, and still being harder than the overall sintered ceramic structure. It has been found by experiment, for example, that the depth of the scratch caused by a stylus (radius=100 microns) sliding under a load of 30 Newtons is approximately 4-6 microns on an uncoated sintered alumina substrate, while the scratch depth on an identical substrate coated with a 3 micron thick chromium nitride strengthening layer is only 2-3 microns.

The strengthening layer 23 can be formed by conventional vapor deposition techniques including, but not limited to sputtering, cathodic arc evaporation (CAE), and CVD. The most preferred methods are sputtering, CAE, or other means which may be carried out at a relatively low temperature, thereby minimizing thermally-induced stresses in the coating stack upon cooling. If the strengthening layer 23 is deposited by CAE, it is also desirable to use macroparaticle filtering in order to control and to preserve the smoothness of the surface of the substrate 18. The strengthening layer 23 can also be formed by other well-known methods for forming hard coatings such as spray pyrolysis, sol-gel techniques, liquid-dipping with subsequent thermal treatment, nano-fabrication methods, atomic-layer deposition methods, and molecular-layer deposition methods.

The strengthening layer 23 can alternatively be formed by a process that produces a hardened surface layer on the substrate base material. Such processes include, for example, thermal oxidation, plasma nitriding, ion implantation, chemical and electrochemical surface treatments such as chemical conversion coatings, anodizing including hard anodizing and conventional post-treatments, micro-arc oxidation and case hardening. The strengthening layer 23 can also include multiple layers 24 and 25 as shown in FIG. 4, in which the layers 24 and 25 together form the strengthening layer 23. For example, the layer 24 can be an oxide thermally grown on the substrate base material while the layer 25 is a deposited material such as CrN. The strengthening layer 23 can also include more than two layers, and can preferably comprise for example a superlattice type of coating with a large number of very thin alternating layers. Such a multilayer or superlattice form of the strengthening layer 23 can also include one or multiple layers of amorphous diamond.

In the multi-layer structure of FIGS. 1-4 the amorphous diamond layer 30 is deposited over the strengthening layer 23 to form an exterior surface layer. The purpose of the amorphous diamond layer 30 is to provide a very hard wear abrasion resistant and lubricous top surface on the sliding components. Amorphous diamond is a form of non-crystalline carbon that is well known in the art, and is also sometimes referred to as tetrahedrally-bonded amorphous carbon (taC). It can be characterized as having at least 40 percent sp3 carbon bonding, a hardness of at least 45 gigaPascals and an elastic modulus of at least 400 gigaPascals. Amorphous diamond materials are described in U.S. Pat. Nos. 5,799,549 and 5,992,268, both of which are incorporated herein by reference. The amorphous diamond material layer 30 can be applied processes including, for example, conventional filtered cathodic arc evaporation and laser ablation. The term amorphous diamond as used herein includes all forms of taC type carbon and may also contain doping or alloying elements such as nitrogen and metals, and also includes nano-structured materials containing amorphous diamond. Nano-structured materials mean herein materials having structural features on the scale of nanometers or tens of nanometers, including but not limited to superlattices.

Figure 5:
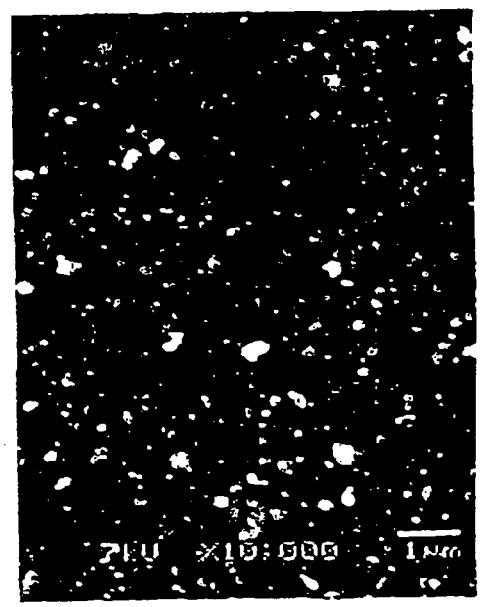
FIG. 5 is a photomicrograph of the surface appearance of an exterior amorphous diamond layer over an underlying substrate or layer.

The thickness of the amorphous diamond layer 30 is at least a value effective to provide improved wear and abrasion resistance of the sliding component. This thickness is generally at least about 100 nm, preferably at least about 200 nm and more preferably at least about 300 nm. The upper thickness range of the layer 30 is determined by material characteristics, economic considerations and the need to minimize thickness-dependent intrinsic stresses in the layer 30 as discussed below. Also amorphous diamond layer 30 advantageously exhibits an extremely smooth surface topology as can be seen by reference to the photo of FIG. 5, principally because there are no individual diamond grains in an amorphous coating. In addition, the surface topography of the thin amorphous diamond layer 30 essentially replicates that of the subsurface upon which it is deposited, and therefore the amorphous diamond layer 30 has substantially the same average surface roughness as that of the subsurface. Graphitic inclusions, visible as light spots in FIG. 5, do not contribute to the surface roughness, as the term is used herein, because they are very soft and are reduced to a lubricative powder when the sliding surfaces are brought into contact. Amorphous diamond has the further advantage that it can be deposited at much lower temperatures (generally below approximately 250 C) than polycrystalline diamond, thus eliminating the need for the thick, engineered interface layers disclosed in the prior art (see, e.g. U.S. Pat. No. 6,165,616) for relieving the thermally-induced stress in the diamond layer. These thermally induced stresses arise during cooling after deposition at the high temperatures characteristic of CVD, and are due to the difference in thermal expansion coefficient between the substrate and the diamond coating. We have found that the type of calculations disclosed in the '616 patent for determining the thickness of its thermally-induced stress relieving interface layer are not necessary for amorphous diamond films due to the low deposition temperature.

One characteristic of amorphous diamond is that it develops high intrinsic (non-thermally-induced) internal stresses, which increase as the coating thickness increases and which are predominately related to atomic bonding distortions and not to thermal expansion/contraction. While this intrinsic stress is believed to contribute to the high hardness of the material, it also limits the coating thickness since stress-induced forces tend to cause delamination of the coating from the substrate 18 (or the strengthening layer 23) above a certain thickness. Although amorphous diamond can be deposited directly on a metal, glass or iron aluminide disk (optionally with an adhesion layer), it is difficult to deposit a thick enough layer to provide adequate scratch resistance for water valve applications. Scratch resistance is important because water supplies sometimes contain abrasive contaminants due to pipeline breaks, construction, etc. The additional strengthening layer 23 of the present invention provides better support of the amorphous diamond layer 30 than does the softer substrate material, advantageously allowing a thinner layer of amorphous diamond to be used, while still obtaining improved scratch and abrasion resistance. The strengthening layer 23 can also be chosen to be a material that has a greater deposition rate and/or is less expensive to deposit than the amorphous diamond layer 30, in order to minimize overall coating cost while maintaining performance. In the most preferred embodiment, an upper thickness limit for the amorphous diamond layer 30 of around 1-2 microns can be used to avoid stress-induced delamination, while an upper thickness of around 800 nm, and more preferably around 300-500 nm, can be desirable for economic reasons while still achieving the desired performances characteristics.

Amorphous diamond is well suited to wet sliding applications in water valve applications. In particular it has been shown to have a very low coefficient of friction and also extremely low abrasion wear in water-lubricated sliding tests in which both sliding surfaces are coated with amorphous diamond. In contrast, DLC coatings are known to have higher friction coefficients higher wear rates, and to deteriorate in frictional performance with increasing humidity. A further advantage of amorphous diamond is that the relatively low deposition temperature allows a wider choice of substrate materials and minimizes or eliminates permanent thermally induced distortion of the substrate.

Regarding the low coefficient of friction reported for amorphous diamond coatings in water-lubricated sliding tests, it is thought that this may be due at least in part to graphitic inclusions (commonly called macroparticles) that are incorporated in amorphous diamond coatings made by some methods. Such graphitic inclusions can be numerous in carbon coatings deposited by cathodic arc evaporation, depending on the choice target materials and use of macroparticle filtering means as discussed below. These graphitic inclusions do not degrade the performance of the amorphous diamond coating due their softness and the small fraction of the total surface area they occupy. Rather, it is thought that they may improve performance by increasing lubricant retention between the sliding plates.

It is disclosed in U.S. Pat. No. 5,401,543 (incorporated herein by reference) that amorphous diamond coatings which are essentially free of macroparticles can be deposited by cathodic arc evaporation from a vitreous carbon or pyrolytic graphite cathode. The maximum density of macroparticles (graphitic inclusions) in such coatings, as calculated from the areal dimensions of the photographic figures and the macroparticle counts disclosed, is around 200 macroparticles per square millimeter. Such macroparticle-free amorphous diamond coatings can be used as layer 30 in the present invention, but are less-preferred than those deposited from an ordinary graphite cathode and containing substantial numbers of graphitic inclusions, such as, for example, at least about 500 per square millimeter. They are also less preferred because the required vitreous carbon or pyrolytic graphite cathodes are quite expensive compared to ordinary graphite.

The number of graphitic inclusions 40 incorporated into coatings (see FIG. 4 showing them schematically) deposited by filtered arc evaporation from an ordinary graphite cathode can be controlled according to the present invention by choosing the filter design and operating parameters so as to allow the desired number of macroparticles to be transmitted through the source. The factors influencing the transmission of macroparticles through a filter are discussed e.g. in U.S. Pat. No. 5,840,163, incorporated herein by reference. Filter designs and operating parameters are conventionally chosen to minimize the number of macroparticles transmitted through the source, however this choice also generally reduces the (desired) output of carbon ions and hence reduces the deposition rate. Contrary to this usual practice, we find that it is preferable for purposes of minimizing coating cost to choose the filter design and operating parameters so as to maximize the carbon ion output of the source (i.e. the deposition rate) without exceeding the maximum tolerable number of graphitic inclusions incorporated into the coating. The maximum tolerable number of inclusions is that number above which the performance of the coated parts deteriorates unacceptably due to the increasing fraction of the surface area occupied by the inclusions. Critical performance factors can include non-leakage of the working fluid, sliding friction coefficient, scratch and abrasion resistance, and wear life. We have found that graphitic inclusion surface densities substantially higher than 500/mm$^2$ are tolerable, and may be beneficial as described above.

The adhesion of the amorphous diamond layer 30 to a nitride form of the strengthening layer 23 can in some cases be improved by the introduction of a carbon-containing gas, such as methane, during a short period at the end of the deposition of the strengthening layer 23. This results in a thin transition zone of carbo-nitride and/or carbide material between the strengthening layer 23 and the amorphous diamond layer 30. In other cases the adhesion can be improved by turning off all reactive gasses during a short period at the end of the deposition of the strengthening layer 23. This results in a thin metal layer between the strengthening layer 23 and the amorphous diamond layer 30. It has also been noted that the introduction of methane during the filtered-arc deposition of the amorphous diamond layer 30 increases the coating deposition rate, and can also improve the coating hardness and scratch resistance. In still other cases, for example the case in which the amorphous diamond layer 30 is to be deposited on a thermally oxidized metal surface, it can be desirable to deposit the separate adhesion-promoting layer 21 between the strengthening layer 23 and the amorphous diamond layer 30. Suitable materials for the adhesion layer 21 can include for example refractory carbide-forming metals, such as, Ti, Ta, and W, and various transition metals such as Cr, and can also include carbides of those metals.

In order that the invention may be more readily understood the following examples are provided. The examples are illustrative and do not limit the invention to the particular features described.

Example 1

Clean stainless steel valve disks are placed in a vacuum deposition chamber incorporating an arc evaporation cathode and a sputtering cathode. The arc source is fitted with filtering means to reduce macroparticle incorporation in the coating, as described for example in U.S. Pat. Nos. 5,480,527 and 5,840,163, incorporated herein by reference. Sources of argon and nitrogen are connected to the chamber through a manifold with adjustable valves for controlling the flowrate of each gas into the chamber. The sputtering cathode is connected to the negative output of a DC power supply. The positive side of the power supply is connected to the chamber wall. The cathode material is chromium. The valve disks are disposed in front of the cathode, and may be rotated or otherwise moved during deposition to ensure uniform coating thickness. The disks are electrically isolated from the chamber and are connected through their mounting rack to the negative output of a power supply so that a bias voltage may be applied to the substrates during coating.

Prior to deposition the vacuum chamber is evacuated to a pressure of 2×10e-5 Torr or less. Argon gas is then introduced at a rate sufficient to maintain a pressure of about 25 milliTorr. The valve disks are then subjected to a glow discharge plasma cleaning in which a negative bias voltage of about 500 volts is applied to the rack and valve disks. The duration of the cleaning is approximately 5 minutes.

A layer of chromium having a thickness of about 20 nm is then deposited on the valve disks by sputtering. After the chromium adhesion layer is deposited, a strengthening layer of chromium nitride having a thickness of about 3 microns is deposited by reactive sputtering.

After the chromium nitride layer is deposited, the valve disks are disposed facing the arc source, and a top amorphous diamond layer having a thickness of about 300 nm is deposited by striking an arc on the carbon electrode and exposing the substrates to the carbon plasma exiting the source outlet. A negative DC bias of about 500 volts is initially applied to the substrates to provide high-energy ion bombardment for surface cleaning and bonding improvement. After about 5 minutes at high bias voltage, the bias voltage is reduced to about 50 volts for the remainder of the deposition process. An argon pressure of about 0.5 milliTorr is maintained in the chamber during deposition. Pulsed or AC bias voltages may alternatively be employed, and a higher or lower argon may also be maintained in order to stabilize the arc source operation and optimize coating properties.

It has been found by experiment that valve disks made of stainless steel and coated according to the above example were able to withstand more than 15,000 test cycles in circulating water carrying 20 micron silica sand, while standard uncoated alumina valve disks failed under the same conditions in less than 2500 cycles.

Example 2

Clean zirconium valve disks are placed into an air oven, heated to a temperature of 560 C, held at this temperature for about 6 hours, and cooled. A strengthening layer of zirconium oxide is thereby formed on the substrate surface, having a thickness of 5-10 microns. The disks are then placed in a vacuum deposition chamber incorporating a filtered arc evaporation cathode and a sputtering cathode. An adhesion layer of chromium having a thickness of about 20 nm is deposited on the valve disks by sputtering as described in example 1. After the chromium adhesion layer is deposited, an amorphous diamond layer is deposited as described in Example 1.

Valve disks made of zirconium and treated as described to form a multilayer structure on their surfaces were tested for scratch resistance, using a scratch tester with variable loading. The scratch depths generated on the treated Zr disks by a stylus tip having 100 micron radius under a load of 3 Newtons were around 4.7 microns deep, while those on untreated Zr disks were about 9.5 microns or more than twice as deep. Scratch test performance is believed to be a relevant predictor of scratch and abrasion resistance in field applications.

Example 3

Clean molded-glass valve disks are placed in a vacuum deposition chamber incorporating a laser ablation source, a PECVD source, and a sputtering cathode. The valve disks are subjected to a RF (radio-frequency) discharge plasma cleaning by known means. An adhesion layer of titanium having a thickness of about 20 nm is then deposited on the valve disks by sputtering. A strengthening layer of DLC having thickness of about 3 microns is then deposited on top of the adhesion layer by PECVD using known deposition parameters. An amorphous diamond layer having thickness of about 300 nm is then deposited on top of the DLC layer by laser ablation using typical deposition parameters.

Example 4

Clean stainless steel valve disks are placed in a vacuum chamber containing a filtered arc evaporation source and a sputtering cathode. The chamber is evacuated, nitrogen gas is introduced, a plasma discharge is established between the disks and the chamber walls, and the disk surface is plasma-nitrided according to known parameters. Nitrogen diffuses into the stainless substrates to form a surface layer harder than the bulk substrate, and the process is continued for a period of time sufficient for the layer depth to reach about 2 microns. A superlattice consisting of multiple alternating layers of carbon nitride and zirconium nitride is then deposited on the nitrided stainless steel surface by filtered arc evaporation and sputtering respectively. The alternating individual layers are about 10 nm thick, and about 100 layers of each material is deposited for a total superlattice thickness of about 2 microns. The ratio of nitrogen to carbon in the carbon nitride layers is preferably around 1.3, since carbon nitride+zirconium nitride superlattices having this N:C ratio have been shown to have primarily sp3-bonded carbon and hardness in the range of 50 gigaPascals. Carbon nitride as used herein refers to a material having a N:C ratio between about 0.1 and 1.5.

The large number of thin layers may conveniently be deposited by mounting the substrate on a rotating cylinder such that the substrates pass first in front of one deposition source and then the other, such that one pair of layers is deposited during each revolution of the cylinder. The total strengthening layer thickness is about 4 microns including the plasma-nitrided stainless steel layer. An amorphous diamond layer having thickness of about 200 nm is then deposited on top of the superlattice layer by filtered arc evaporation as described in Example 1.

Those reviewing the present disclosure will appreciate that a variety of combinations may be possible within the scope of the present invention. For example, according to an exemplary embodiment, a valve plate that is formed of alumina or another suitable material may be coated with a first layer of chromium and a second layer of chromium nitride, after which a layer of amorphous diamond may be applied thereon. According to another exemplary embodiment, a valve plate that is formed of alumina or another suitable material may have a first layer of tantalum provided thereon, after which a layer of tantalum carbide or tantalum carbo-nitride may be provided prior to the application of a layer of amorphous diamond.

The construction and arrangement of the elements shown in the preferred and other exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, use of materials, etc.) without materially departing from the novel teachings and advantages of the subject matter recited herein. For example, a faucet may include an amorphous diamond coating on only one or on both of the disks included in the assembly. The order or sequence of any process or method steps may be varied or re-sequenced according to alternative embodiments. Other substitutions, modifications, changes and omissions may be made in the design, operating conditions and arrangement of the preferred and other exemplary embodiments without departing from the scope of the present invention.

What is claimed is:

1. A component for a faucet valve comprising:
a substrate comprising alumina;
a material comprising titanium and carbon provided on a surface of the substrate; and
an amorphous material comprising carbon provided on the material comprising titanium and carbon, the amorphous material comprising carbon and having tetrahedral bonding of at least about 40%.

2. The component of claim 1, wherein the amorphous material has a lower coefficient of friction and a higher hardness than diamond-like carbon.

3. The component of claim 1, wherein the amorphous material further comprises nitrogen.

4. The component of claim 1, wherein the material comprising titanium and carbon comprises titanium carbide.

5. The component of claim 1, wherein the amorphous material has a hardness of at least 40 gigapascals and an elastic modulus of at least 400 gigapascals.

6. The component of claim 1, further comprising an adhesion-promoting layer that comprises titanium.

7. The component of claim 1, wherein the amorphous material has a thickness of at least about 100 nanometers.

8. The component of claim 1, wherein the amorphous material has a thickness of at least about 300 nanometers.

9. A faucet comprising:
a first component comprising a substrate comprising alumina, a strengthening layer on the substrate comprising titanium and carbon, and a material provided over the strengthening layer that comprises carbon, the material having tetrahedral bonding of at least about 40%.

10. The faucet of claim 9, further comprising a second component configured for sliding engagement with the first component, the second component comprising a substrate comprising alumina, a strengthening layer on the substrate comprising titanium and carbon, and a material provided over the strengthening layer that comprises carbon, the material having tetrahedral bonding of at least about 40%.

11. The faucet of claim 9, wherein the material further comprises nitrogen.

12. The faucet of claim 9, wherein the material has a hardness of at least 40 gigapascals and an elastic modulus of at least 400 gigapascals.

13. The faucet of claim 9, wherein the material has a thickness of at least about 100 nanometers.

14. The faucet of claim 9, wherein the material has a thickness of at least about 300 nanometers.

15. The faucet of claim 9, wherein the material is amorphous.

16. The faucet of claim 9, wherein the material further comprises graphite.

17. The faucet of claim 9, wherein the strengthening layer comprises titanium carbide.

18. The faucet of claim 9, wherein the strengthening layer has a thickness of between approximately 2,000 and 5,000 nanometers.

19. A component for a water mixing valve comprising:
 an alumina substrate;
 a strengthening layer on the alumina substrate that comprises titanium and carbon; and
 a coating provided over the strengthening layer that comprises carbon having tetrahedral bonding of at least about 40%.

20. The component of claim 19, wherein the coating is amorphous.

21. The component of claim 19, wherein the coating further comprises nitrogen.

22. The component of claim 19, wherein the strengthening layer comprises titanium carbide.

23. The component of claim 19, further comprising an adhesion-promoting layer between the strengthening layer and the coating.

24. The component of claim 23, wherein the adhesion-promoting layer comprises titanium.

25. The component of claim 19, wherein the coating has a hardness of at least 40 gigapascals.

26. The component of claim 19, wherein the coating has an elastic modulus of at least 400 gigapascals.

27. The component of claim 19, wherein the coating has a thickness of at least about 100 nanometers.

28. The component of claim 19, wherein the coating has a thickness of at least about 300 nanometers.

29. The component of claim 19, wherein the coating has a coefficient of friction that is lower than that of diamond-like carbon.

30. The component of claim 19, wherein the coating further comprises graphite.

31. The component of claim 19, wherein the component is a disk.

32. The component of claim 19, wherein the component is configured for sliding engagement with another component in a faucet.

* * * * *